United States Patent [19]

Hang et al.

[11] Patent Number: 4,808,673

[45] Date of Patent: Feb. 28, 1989

[54] DIELECTRIC INKS FOR MULTILAYER COPPER CIRCUITS

[75] Inventors: Kenneth W. Hang, West Windsor Township, Mercer County; Ashok N. Prabhu, East Windsor Township, Mercer County; Wayne M. Anderson, Hamilton Township, Mercer County, all of N.J.

[73] Assignee: General Electric Company, Schenectady, N.Y.

[21] Appl. No.: 87,584

[22] Filed: Aug. 20, 1987

Related U.S. Application Data

[63] Continuation-in-part of Ser. No. 914,302, Oct. 2, 1986, abandoned.

[51] Int. Cl.$^4$ .............................................. C08K 3/34
[52] U.S. Cl. ...................... 524/413; 252/512; 427/126.3; 524/414; 524/432; 524/433
[58] Field of Search ................ 523/160; 524/560, 413, 524/414, 432, 433; 106/20

[56] References Cited

U.S. PATENT DOCUMENTS

| | | | |
|---|---|---|---|
| 3,022,179 | 2/1962 | Morrissey | 106/39 |
| 3,501,322 | 3/1970 | Dumbaugh, Jr. et al. | 106/48 |
| 3,876,407 | 4/1975 | Hirose et al. | 65/30 |
| 4,049,872 | 9/1977 | Hang | 428/427 |
| 4,061,584 | 12/1977 | Girard et al. | 252/63 |
| 4,256,796 | 3/1981 | Hang et al. | 428/210 |
| 4,355,114 | 10/1982 | Hang et al. | 501/5 |
| 4,355,115 | 10/1982 | Hang et al. | 501/21 |
| 4,369,220 | 1/1983 | Prabhu et al. | 428/209 |
| 4,369,254 | 1/1983 | Prabhu et al. | 501/21 |
| 4,376,725 | 3/1983 | Prabhu et al. | 252/512 |
| 4,377,642 | 3/1983 | Prabhu et al. | 501/20 |
| 4,385,127 | 5/1983 | Chyung | 501/5 |
| 4,399,320 | 8/1983 | Prabhu et al. | 174/68.5 |
| 4,400,214 | 8/1983 | Ogawa et al. | 106/1.13 |
| 4,401,709 | 8/1983 | Prabhu et al. | 428/209 |
| 4,415,624 | 11/1983 | Prabhu et al. | 428/209 |
| 4,514,321 | 4/1985 | Siuta | 252/512 |
| 4,521,329 | 6/1985 | Siuta et al. | 252/512 |
| 4,536,535 | 8/1985 | Usala | 524/403 |
| 4,540,604 | 9/1985 | Siuta | 427/96 |
| 4,619,836 | 10/1986 | Prabhu et al. | 427/41 |
| 4,623,482 | 11/1986 | Kuo et al. | 252/512 |

FOREIGN PATENT DOCUMENTS 0084936 8/1983 European Pat. Off. .
174544 10/1984 Japan .

Primary Examiner—Christopher Henderson
Attorney, Agent, or Firm—James Magee, Jr.; James C. Davis, Jr.

[57] ABSTRACT

An improved dielectric ink for the fabrication of multilayer, integrated circuits is disclosed. The subject inks comprise a devitrifying zinc-magnesium-barium-aluminum-zirconium-phosphosilicate glass frit, a devitrifying zinc-magnesium-barium-aluminum-silicate glass frit, or a devitrifying zinc-magnesium-strotium-aluminum-silicate glass frit, an organic vehicle and, optionally, a suitable ceramic filler material. The subject glass frit containing a suitable ceramic filler can be fabricated into stand-alone substrates useful in a wide variety of electronic applications. The glass frit of the subject inks has a high softening temperature which facilitates complete removal of carbonaceous residues of the vehicle from the dried ink during firing. This is advantageous in that it eliminates the need to incorporate oxygen-generating additives, such as barium nitrate, in the ink or treatment of the ink in an oxidizing or reducing plasma prior to firing. The disclosed inks are particularly advantageous in the fabrication of multilayer integrated circuits based on copper conductors.

15 Claims, No Drawings

DIELECTRIC INKS FOR MULTILAYER COPPER CIRCUITS

The U.S. Government has rights in this invention pursuant to Contract No. N00024-82-C-5110 awarded by the Department of the Navy.

This application is a continuation-in-part of U.S. patent application Ser. No. 914,302, filed Oct. 2, 1986 now abandoned.

This invention relates to thick-film dielectric materials and their use in fabricating multilayer electrical circuit structures, particularly copper-based structures.

BACKGROUND OF THE INVENTION

The use of specialized ink formulations to form thick films having various functions on suitable substrates in the construction of multilayer integrated circuits is known in the art. Such technology is of increasing interest in the fabrication of very dense multilayer circuit patterns on various substrates for a wide variety of applications in the electronics industry.

Thick-film multilayer structures typically are comprised of at least two patterned layers of a conductor separated by a dielectric layer. The patterned conductor layers are connected by a metallic conductor deposited in vias in the dielectric layer. Such structures are formed by multiple deposition and firing of layers of conductor and dielectric inks.

Such multilayer circuit structures utilizing copper as the conductor metal have a number of problems. The most common is failure caused by the development of electrical shorts due to interactions between materials of the copper conductor ink and the dielectric layer which take place during the multiple firings necessary to fabricate multilayer integrated circuits. If the dielectric material is not resistant to the penetration of flux components, conductive channels may be formed in the dielectric during the repeated firings. When such a channel passes completely through a dielectric layer and makes contact between an overlying and underlying copper conductor, an electrical short is produced.

A second problem common to multilayer circuits is porosity in the fired dielectric layer resulting from the evolution of gases from organic vehicle materials and/or oxides of bismuth and copper during firing. Contaminant materials, e.g. molten eutectic phases from fired copper conductor layers, can readily leach into the resulting passages. The integrity of the dielectric layers in a multilayer structure is also important because the voids therein lower the resistance of the dielectric, which is undesirable. It is conventional to print and fire at least two layers of dielectric ink between conductors to minimize the possibility that evolving gases will form connected passages through the dielectric.

It is possible to reduce the tendency of contaminant materials to leach into a dielectric material by formulating the ink with a higher quantity of glass frit thereby decreasing the porosity of the fired material. However, both this solution and the multiple print and fire approach can result in the trapping of gases within the dielectric layer. This will cause both the dielectric layer and overlying conductor layers to blister and peel during subsequent nitrogen firings.

Typically, the glass phase of a glass-filled dielectric will flow and densify at between 500°-650° C. Ideally, all traces of the organic vehicle in the ink should be removed before the glass flows and densifies. Conventionally, this is not readily achieved without the addition of oxidizer constituents such as barium nitrate. While such additives are effective in removing trace amounts of carbonaceous material, they are known to evolve gas, particularly oxygen, during subsequent firings. These gases can cause blistering and peeling of subsequently applied layers and can substantially increase the porosity of overlying dielectric layers. In addition, the gases evolved from these materials can react with copper from adjacent copper conductors and via fills to form copper oxide which, in turn, can react with flux materials and form an eutectic phase which will readily penetrate porous dielectric material.

Another approach to ensure removal of carbonaceous residues from a dielectric material is to treat the dried ink, before firing, with an oxidizing or reducing plasma as disclosed by Prabhu et al. in U.S. Pat. No. 4,619,836, issued Oct. 28, 1986. This treatment, while a significant improvement, does introduce an additional processing step and additional apparatus requirements into the manufacture of copper-based multilayer circuitry.

In accordance with this invention, there are provided novel dielectric inks which form dielectric layers having reduced porosity without oxidizers, such as barium nitrate, or a plasma treatment prior to firing.

SUMMARY OF THE INVENTION

An improved dielectric ink comprises a novel devitrifying zinc-magnesium-barium-aluminum-zirconium-phosphosilicate glass frit, a novel devitrifying zinc-magnesium-barium-aluminum-silicate glass frit, or a novel zinc-magnesium-strontium-aluminum-silicate glass frit and a suitable organic vehicle with, optionally, up to about 30 percent by weight of a ceramic filler. The inks are useful in the fabrication of multilayer integrated circuit structures, particularly those based on copper, and in forming stand-alone substrates.

DETAILED DESCRIPTION OF THE INVENTION

The novel dielectric inks of this invention are useful, for example, in the fabrication of multilayer integrated circuit structures. While the subject inks can be utilized in the fabrication of multilayer structures incorporating other metallic conductors such as silver, they are particularly suited to the production of such structures based on copper conductors and will be so described herein. The subject inks can likewise be utilized to form stand-alone substrates for a wide variety of electronic applications.

The subject inks are comprised of from about 50 to about 75 percent by weight of the glass frit, from about 15 to about 30 percent by weight of a suitable organic vehicle and up to about 30 percent by weight of a suitable ceramic filler. More preferred ink compositions contain from about 60 to 70 percent by weight of the glass frit, from about 20 to 25 percent by weight of the organic vehicle and from about 5 to 15 percent by weight of the filler. In some applications, particularly when the devitrifying zinc-magnesium-barium-aluminum-silicate glass frit is used with an alumina substrate, the preferred ink compositions contain from about 60 to about 75 percent by weight of the glass frit, from about 20 to about 25 percent by weight of the organic vehicle and from about 1 to about 10 percent of the filler.

The devitrifying zinc-magnesium-barium-aluminum-zirconium-phosphosilicate glass frit of the inks of this invention comprises, on a weight basis:
(a) from about 15 to about 25 percent of zinc oxide (ZnO);
(b) from about 10 to about 25 percent of magnesium oxide (MgO);
(c) from about 3 to about 12 percent of barium oxide (BaO);
(d) from about 5 to about 20 percent of aluminum oxide ($Al_2O_3$);
(e) from about 35 to about 50 percent of silicon dioxide ($SiO_2$);
(f) from about 0.5 to about 3 percent of phosphorus pentoxide ($P_2O_5$); and
(g) from about 1 to about 5 percent of zirconium silicate ($ZrSiO_4$).

Preferred glass formulations in accordance with this invention contain, on a weight basis: from about 16 to about 22 percent of ZnO; from about 16 to about 22 percent of MgO; from about 5 to about 10 percent of BaO; from about 8 to about 11 percent of $Al_2O_3$; from about 39 to 43 percent of $SiO_2$; from about 1 to about 2 percent of $P_2O_5$; and from about 2 to about 3 percent of $ZrSiO_4$.

The devitrifying zinc-magnesium-barium-aluminum-silicate glass frit of the inks of this invention comprises, on a weight basis:
(a) from about 15 to about 25 percent of zinc oxide (ZnO);
(b) from about 10 to about 25 percent of magnesium oxide (MgO);
(c) from about 3 to about 12 percent of barium oxide (BaO);
(d) from about 5 to about 20 percent of aluminum oxide ($Al_2O_3$);
(e) from about 35 to about 50 percent of silicon dioxide ($SiO_2$);
(f) from 0 to about 3 percent of phosphorus pentoxide ($P_2O_5$) and
(g) from 0 to about 5 percent of zirconium silicate ($ZrSiO_4$).

When the devitrifying zinc-magnesium-barium-aluminum-silicate glass frit of the present invention contains, on a weight basis, from 0 to about 0.5 percent of phosphorus pentoxide and from 0 to about 1 percent zirconium silicate, the crystallization rate is increased. This particular frit is useful when it is desirable to have a dielectric ink which is highly resistant to flow.

More preferred devitrifying glass frit formulations in accordance with this invention comprise, on a weight basis: from about 17 to about 23.5 percent ZnO; from about 17 to about 23.5 percent MgO; from about 5 to about 10 percent BaO; from about 8 to about 11 percent $Al_2O_3$; and from about 39 to about 43 percent $SiO_2$.

The devitrifying zinc-magnesium-strontium-aluminum-silicate glass frit of the inks of this invention comprises, on a weight basis:
(a) from about 15 to about 25 percent of zinc oxide (ZnO);
(b) from about 10 to about 25 percent of magnesium oxide (MgO);
(c) from about 3 to about 12 percent of strontium oxide (SrO);
(d) from about 5 to about 20 percent of aluminum oxide ($Al_2O_3$);
(e) from about 35 to about 50 percent of silicon dioxide ($SiO_2$);
(f) from 0 to about 3 phosphorus pentoxide ($P_2O_5$) and
(g) from 0 to about 5 zirconium silicate ($ZrSiO_4$).

A preferred devitrifying zinc-magnesium-strontium-aluminum-silicate glass frit in accordance with this invention comprises, on a weight basis: from about 17 to about 23.5 percent ZnO; from about 17 to about 23.5 percent MgO; from about 3 to about 10 percent SrO; form about 7 to about 11 percent of $Al_2O_3$; from about 38 to about 43 percent of $SiO_2$; form 0 to about 2 percent of $P_2O_5$; and from 0 to about 2 percent of $ZrSiO_4$.

The glass frits are conventionally prepared by comminuting the various oxides, thoroughly mixing them in the appropriate proportion and melting the mixed oxides, e.g. in air at 1450°–1600° C.

The stand-alone substrate suitable for integrated circuit fabrication comprises from about 65 to about 100 percent by weight of the devitrifying glass frits of the present invention and up to about 35 percent by weight of a suitable ceramic filler.

The stand-alone substrate or other suitable substrates, such as alumina, can be used in conjunction with the dielectric inks of the present invention to produce a multilayer circuit structure, particularly an integrated circuit structure. The substrate for the circuit structure contains at least two patterned layers of a conductor, such as copper, which are separated by a dielectric layer made from the subject inks. The dielectric layer contains vias which are filled with a conductor to contact the patterned conductor layers. The dielectric layer comprises from about 65 to 100 percent by weight of the devitrifying glass frits of the present invention and up to about 35 percent, preferably about 5 to about 26 percent, by weight of a suitable ceramic filler.

For most applications, the subject inks may comprise only the devitrifying glass frit and a suitable organic vehicle. However, for certain applications, such as the production of stand-alone substrates, or to provide a dielectric material whose coefficient of expansion is closely matched to a conventional substrate, e.g. alumina, up to about 30 percent by weight of a conventional ceramic filler is included in the ink. The subject inks preferably contain from about 5 to about 15 percent by weight of the filler. Suitable ceramic fillers in accordance with this invention include alumina ($Al_2O_3$), barium dimagnesium disilicate ($BaMg_2Si_2O_7$), dimagnesium borate ($Mg_2B_2O_5$), zirconium silicate ($ZrSiO_4$), dimagnesia silicate ($2MgO \cdot SiO_2$), dimagnesia dialumina pentasilicate ($2MgO \cdot 2Al_2O_3 \cdot 5SiO_2$), magnesium aluminate ($MgAl_2O_4$) and mixtures thereof. A preferred filler in accordance with this invention is a mixture of alumina and barium dimagnesium disilicate in a weight ratio of about 2:1 and more preferably about 4:1 when the devitrifying zinc-magnesium-barium-aluminum-silicate glass frit is employed in a dielectric ink used to form a multilayer structure on an alumina substrate.

In preparing the subject inks, the glass frit and the filler, if present, are reduced to a particle size of from about 1–5 micrometers. The solid particles are combined with the organic vehicle and throughly mixed to make the ink. The organic vehicle is selected to give screen printing characteristics to the inks and to burn off cleanly in nitrogen or air, i.e. without leaving a carbonaceous residue.

The organic vehicles are solutions of resin binders such as, for example, cellulose derivatives, particularly ethyl cellulose, synthetic resins such as polyacrylates, polymethacrylates, polyesters, polyolefins and the like in a suitable solvent. A preferred binder is poly(isobutylmethacrylate). In general, conventional solvents utilized in inks of the type described herein may be used. Preferred commercially available solvents include, for example, pine oil, terpineol, butyl carbitol acetate, 2,2,4-trimethyl-1,3-pentanediol monoisobutyrate, available from Texas Eastman Company under the trademark Texanol and the like. The vehicles suitably contain from about 5 to about 25 percent by weight of the resin binder. However, it may be necessary to add more solvent to the organic vehicle to adjust the ink rheology. Thus, the organic vehicle may contain from about 2 to about 25 percent by weight of the resin binder. The vehicles also suitably contain from about 0.5 to about 10, preferably from about 1 to about 3, percent by weight of a suitable surfactant such as oleylamine, available as Armeen O or a high molecular weight N-alkyl-1,3-diaminopropane dioleate, available as Duomeen TDO, both from AKZO Chemie America.

The above resin binders may be utilized individually or in any combination of two or more. A suitable viscosity modifier can be added to the resin material if desired. Such a modifier can be, for example, a castor oil derivative available from NL Industries under the trademark Thixatrol. Regardless of the vehicle utilized, it is important that the homogeneity of the ink be maximized. Therefore, mixing is suitably carried out in a conventional apparatus which mixes in combination with subjecting the dispersion to high shearing action.

The dielectric inks of this invention are applied to substrate structures by conventional means, i.e. screen printing, brushing, spraying and the like with screen printing being preferred. Generally, as is conventional in the art, several individually dried and fired layers of dielectric are utilized to minimize the potential for through pin holes. The inks may also be applied to conventional release tape, dried and applied to the substrate as a layer. The layers may also be fired on a release surface, removed and utilized as stand-alone substrates. Other conventional methods of forming stand-alone substrates, such as injection molding, can also be utilized.

The coating of the ink is dried in air at 100°–125° C. for from 10 to 20 minutes and fired in nitrogen at 850°–950° C. for from 5 to 15 minutes to form a dielectric layer comprising from about 65 to 100, preferably from about 74 to about 95, percent by weight of the glass frit and up to about 35, preferably from about 5 to about 26, percent by weight of the ceramic filler.

The subject inks are advantageous in that, during firing, the glass frit remains porous to temperatures in excess of 700° C. In comparison to conventional inks containing glass frits that soften and densify at about 600° C., the subject inks provide substantial extra time in the furnace where the furnace gases may penetrate the frit and remove the last residues of carbonaceous material from the vehicle. There is thus-produced a very dense dielectric material. Due to the extra time available to remove the carbonaceous residues during firing, it is not necessary to include art-recognized oxygen-generating components such as barium nitrate in the subject inks, nor to subject the dried inks to an oxidizing or reducing plasma as described in the Prabhu et al. U.S. Pat. No. 4,619,836 mentioned above.

In addition to the above-mentioned advantages, the dielectric layers obtained from the subject inks have good mechanical strength and excellent temperature stability due to the proximity of the glass softening temperature to the firing temperature. It is further advantageous that, due to the absence of significant large modifier ions, dielectric layers formed from the subject inks are particularly resistant to flux penetration. Large modifier ions, when present, provide sites in the glass structure for similarly sized flux ions, such as lead oxide and bismuth oxide, to modify the glass properties. These materials, after repeated firings and in the presence of reducing agents that may be in the furnace atmosphere, may be converted to the free metal, thus providing the conductivity which will cause the circuit to short. A further deterrent to flux penetration into the dielectric layer of this invention is the refractory nature of the crystalline microstructure thereof which is stable upon repeated firing above 900° C. Stand-alone substrates formed from the subject inks are useful in a wide range of applications in the same manner as conventional alumina circuit boards.

The following Examples illustrate this invention, it being understood that the invention is in no way intended to be limited to the details described therein. In the Examples, all parts and percentages are on a weight basis and all temperatures are in degrees Celsius, unless otherwise stated.

EXAMPLE 1

Glasses were prepared by weighing the following components, mixing and melting at about 1550° in air in platinum containers. The melts were quenched with dry counter-rotating ferrous metal rollers having a 0.01 inch gap. The coefficient of expansion of each formulation was determined using a fused silica dilatometer. The coefficient of expansion of the glass is given as alpha and was measured at 900°. The alpha numbers represent a value $\times 10^{-7}$ cm per cm per degree Celsius.

| Constituent | Glass Formulation (Percent) | | | | |
|---|---|---|---|---|---|
| | A | B | C | D | E |
| ZnO | 16.35 | 17.44 | 20.06 | 21.81 | 21.81 |
| MgO | 10.43 | 22.49 | 17.60 | 19.25 | 16.50 |
| BaO | 10.39 | 5.38 | 9.36 | 5.88 | 7.84 |
| $Al_2O_3$ | 16.65 | 8.39 | 9.46 | 9.38 | 10.68 |
| $SiO_2$ | 42.18 | 42.30 | 39.52 | 39.68 | 39.17 |
| $P_2O_5$ | 1.00 | 2.00 | 2.00 | 2.00 | 1.00 |
| $ZrSiO_4$ | 3.00 | 2.00 | 2.00 | 2.00 | 3.00 |
| Alpha (900°) | 78.2 | 92.9 | 74.3 | 77.5 | 73.6 |

Inks were prepared by initially comminuting the thin glass ribbons formed by quenching the melts in a ball-mill to achieve a mean particle size of about 5 micrometers. The glass formulations were individually combined with a ceramic filler comprised of alumina and barium dimagnesium disilicate having an average particle size of about 3 micrometers and an organic vehicle comprised of a 20 percent solution of poly(isobutylmethacrylate) in Texanol also containing one percent of the surfactant Duomeen TDO. the proportion of the ink was 67.7 percent of the glass, 5.8 percent of alumina, 3.9 percent of barium dimagnesium disilicate and 22.6 percent of the organic vehicle.

The ink ingredients were initally hand-mixed, then mixed on a three-roll mill to obtain a smooth paste suitable for screen printing. Additional solvent was added as necessary to assure proper rheology. The inks were individually printed onto platinum foil, air-dried at 125° for about 15 minutes, then fired in nitrogen at about 900° for 10 minutes. A second dielectric layer was similarly printed and fired over the first. A dielectric layer containing glass from formulation D had an expansion coefficient (Alpha) at 900° of 84.

EXAMPLE 2

A copper conductor ink was prepared according to Prabhu et al.'s copending U.S. patent application Ser. No. 914,303 entitled "THICK FILM CONDUCTOR INKS", filed Oct. 2, 1986, now abandoned, the disclosure of which is incorporated herein by reference. The ink contained 76.9 parts of copper powder having an average particle size of 3 micrometers and 7.7 parts of a devitrifying glass frit comprising 9.09 percent of zinc oxide, 30.40 percent of calcium oxide, 18.28 percent of aluminum oxide and 42.23 percent of silicon dioxide. The solid ingredients were mixed with 15.4 parts of an organic vehicle consisting of a 6 percent solution of ethyl cellulose in Texanol, additionally containing the wetting agents Hypothiolate 100 and Armeen O in concentrations of 17 percent and 3 percent, respectively, based on the vehicle. The ink was initially hand-mixed and then mixed on a three-roll mill to obtain a paste suitable for screen printing. Additional solvent was added as required to assure proper rheology.

The copper ink was printed onto a conventional alumina board to form a series of isolated parallel lines 375 micrometers wide separated by spaces of equal width. The copper ink was dried in air at 125° for 15 minutes and fired in nitrogen at 900° for 10 minutes. The dielectric ink of Example 1 containing glass formulation D was printed, dried and fired thereover. Openings or vias were left in the dielectric layer overlying a portion of the copper conductor.

A copper via-fill ink was prepared as follows: a devitrifying glass frit consisting of: 21.8 percent of zinc oxide; 16.5 percent of magnesium oxide; 7.8 percent of barium oxide; 39.2 percent of silicon dioxide; 10.7 percent of aluminum oxide; 1.0 percent of phosphorus pentoxide; and 3.0 percent of zirconium silicate and a vitreous glass frit consisting of: 51.59 percent of barium oxide; 12.58 percent of calcium oxide; 15.62 percent of boron trioxide; and 20.21 percent of silicon dioxide were separately prepared and reduced to a particle size of about three micrometers. Solid ingredients consisting of 65 percent of copper powder having an average particle size of three micrometers, 14 percent of devitrifying frit and 4 percent of the vitreous glass frit were throughly mixed by hand.

The solid ingredients were mixed with 17 parts of an organic vehicle consisting of a 20 percent solution of poly(isobutylmethacrylate) in Texanol additionally containing, as wetting agents, 17 percent of Hypothiolate 100 and 3 percent of Armeen O. The ink was initially hand-mixed and then mixed on a three-roll mill to obtain a paste suitable for screen printing. Additional solvent was added as required to assure proper rheology. The via-fill ink is described in copending U.S. patent application Ser. No. 914,296 of Prabhu et al., entitled "THICK-FILM COPPER VIA-FILL INKS", filed Oct. 2, 1986.

The via-fill ink was printed into the spaces in the dielectric ink, dried in air at 125° for 15 minutes and fired in nitrogen at 900° for 10 minutes. The thickness of the dielectric/copper via-fill was 15 micrometers. The dielectric/copper via-fill depositions were repeated three times to form a final dielectric layer thickness of 45 micrometers. A second layer of the copper conductor ink was deposited and fired over the dielectric so that a portion was in contact with the copper via-fill.

The procedure was repeated three times to obtain a multilayer copper-based device having four buried copper layers. In total, 25 firings were required to complete the multilayer circuit.

The structure was biased through electrical contacts made to the copper layers. No evidence of shorting or loss of contact was observed in any of the copper layers.

EXAMPLE 3

Additional devitrifying glasses of the following composition were prepared and the coefficients of thermal expansion were determined using the procedure of Example 1:

| GLASS FORMULATION (PERCENT) | | |
|---|---|---|
| Constituent | F | G |
| ZnO | 22.72 | 18.29 |
| MgO | 20.05 | 22.35 |
| BaO | 6.13 | 11.15 |
| $Al_2O_3$ | 9.76 | 12.05 |
| $SiO_2$ | 41.34 | 36.16 |
| $P_2O_5$ | 0 | 0 |
| $ZrSiO_4$ | 0 | 0 |
| Alpha (900°) | 77.6 | 82.7 |

Alumina reference substrate Alpha (900°) = 79.8.

Inks employing devitrifying glass frits F and G were prepared using procedures similar to those described in Example 1. The ink employing devitrifying glass frit F had the following formulation: 71.68 percent glass frit F; 1.16 percent barium dimagnesium disilicate; 4.46 percent alumina, 0.19 percent $Cr_2O_3$ (coloring agent); 15.5 percent of 6 parts ethyl cellulose in 100 parts Texanol; 0.97 percent of 10 parts Thixatrol in 100 parts Texanol; 5.81 percent Texanol and 0.23 percent of Duomeen TDO (surfactant).

The dielectric inks employing frits F and G were printed onto conventional alumina substrates and dried in air at 125° for 15 minutes. The dried ink layers were then fired in nitrogen at 900° for 10 minutes.

The dielectric inks prepared from formulations F and G have a higher crystallization rate than the dielectric inks of Example 1 because of the absence of both $P_2O_5$ and $ZrSiO_4$. The dielectric inks prepared with the glasses possessing the increased crystallization rate have a higher crystal content. These dielectric inks are more resistant to flow during the multiple firings employed in the production of multilayer circuits. Additionally, the increased crystallization rate further reduces bubble formation in the dielectric layer.

EXAMPLE 4

Devitrifying glasses of the following composition were prepared and the coefficients of thermal expansion were determined using the procedure of Example 1:

| GLASS FORMULATION (PERCENT) | | | |
|---|---|---|---|
| Constituent | H | I | J |
| ZnO | 22.72 | 24.71 | 21.15 |
| MgO | 20.05 | 20.05 | 22.00 |
| SrO | 4.77 | 7.40 | 6.98 |
| $Al_2O_3$ | 10.39 | 7.96 | 7.49 |
| $SiO_2$ | 42.07 | 39.88 | 38.38 |
| $P_2O_5$ | — | — | 2.00 |
| $ZrSiO_4$ | — | — | 2.00 |
| Alpha (900°) | 73.6 | 58.0 | 79.7 |

Alumina reference substrate Alpha (900°) = 79.8.

An ink containing devitrifying glass frit J was prepared using procedures similar to those described in Example 1. This ink contained 77 percent of solids and 23 percent of the organic vehicle. The solids contained 91.5 percent of frit J, 1.5 percent of barium dimagnesium disilicate, and 7 percent of alumina. The organic vehicle comprised 66.5 percent of 6 weight parts ethyl cellulose in 100 weight parts Texanol, 4.1 percent of 10 weight parts Thixatrol in 100 weight parts Texanol, 29.4 percent of Texanol and 1.0 percent of Duomeen TDO. This ink was then printed onto an alumina substrate and fired using the conditions described in Example 1.

We claim:

1. A dielectric ink for mulitlayer integrated circuit fabrication consisting essentially of:
    (a) from about 50 to about 75 percent by weight of a devitrifying glass frit consisting essentially of, on a weight basis: from about 15 to about 25 percent of zinc oxide; from about 10 to about 25 percent of magnesium oxide; from about 3 to about 12 percent of an oxide selected from the group consisting of barium oxide and strontium oxide; from about 5 to about 20 percent of aluminum oxide; from about 35 to about 50 percent of silicon dioxide; from 0.5 to about 3 percent of phosphorus pentoxide; and from 1 to about 5 percent of zirconium silicate;
    (b) up to about 30 percent by weight of a suitable ceramic filler; and
    (c) from about 15 to about 30 percent by weight of a suitable organic vehicle.

2. A dielectric ink in accordance with claim 1, wherein the organic vehicle comprises a solution of an organic binder in a suitable solvent.

3. A dielectric ink in accordance with claim 1 wherein the glass frit consists essentially of, on a frit weight basis: from about 17 to about 23.5 percent of zinc oxide; from about 17 to about 23.5 percent of magnesium oxide; from about 5 to about 10 percent of barium oxide; from about 8 to about 11 percent of aluminum oxide; and from about 39 to about 43 percent of silicon dioxide.

4. A dielectric ink in accordance with claim 1 wherein the glass frit consists essentially of, on a weight basis: from about 17 to about 23.5 percent of zinc oxide; from about 17 to about 23.5 percent of magnesium oxide; from about 3 to about 10 percent of strontium oxide; from about 7 to about 11 percent of aluminum oxide; from about 38 to about 43 percent of silicon dioxide; from 0.5 to about 2 percent of phosphorus pentoxide and from 1 to about 2 percent of zirconium silicate.

5. A dielectric ink in accordance with claim 1, wherein the ink contains from about 5 to about 15 percent by weight of the filler.

6. A dielectric ink in accordance with claim 5, wherein the filler is selected from the group consisting of alumina, barium dimagnesium disilicate, dimagnesium borate, zirconium silicate, dimagnesia silicate, dimagnesia dialumina pentasilicate, magnesium aluminate and mixtures thereof.

7. A dielectric ink in accordance with claim 6, wherein the filler material is a mixture of alumina and barium dimagnesium disilicate.

8. A dielectric ink in accordance with claim 2, wherein the organic binder is selected from the group consisting of poly(isobutylmethacrylate) and ethyl cellulose.

9. A dielectric ink for multilayer integrated circuit fabrication consisting essentially of:
    (a) from about 50 to about 75 percent by weight of a glass frit consisting essentially of, on a weight basis: from about 15 to about 25 percent of zinc oxide; from about 10 to about 25 percent of magnesium oxide; from about 3 to about 12 percent of barium oxide; from about 5 to about 20 percent of aluminum oxide; from about 35 to about 50 percent of silicon dioxide; from about 0.5 to about 3 percent of phosphorus pentoxide; and from about 1 to about 5 percent of zirconium silicate;
    (b) up to about 30 percent by weight of a suitable ceramic filler; and
    (c) from about 15 to about 30 percent by weight of a suitable organic vehicle.

10. A dielectric ink in accordance with claim 9, wherein the glass frit consists essentially of, on a weight basis: from about 16 to about 22 percent of zinc oxide; from about 16 to about 2 percent of magnesium oxide; from about 5 to about 10 percent of barium oxide; from about 8 to about 11 percent of aluminum oxide; from about 39 to about 43 percent of silicon dioxide; from about 1 to about 2 percent of phosphorus pentoxide; and from about 2 to about 3 percent of zirconium silicate.

11. A dielectric ink in accordance with claim 9, wherein the ink contains from about 5 to about 15 percent by weight of the filler.

12. A dielectric ink in accordance with claim 11, wherein the filler is selected from the group consisting of alumina, barium dimagnesium disilicate, dimagnesium borate, zirconium silicate, dimagnesia silicate, dimagnesia dialumina pentasilicte, mangesium aluminate and mixtures thereof.

13. A dielectric ink in accordance with claim 12, wherein the filler material is a mixture of alumina and barium dimagnesium disilicate.

14. A dielectric ink in accordance with claim 9, wherein the organic vehicle comprises a solution of an organic binder in a suitable solvent.

15. A dielectric ink in accordance with claim 14, wherein the organic binder is poly(isobutylmethacrylate).

* * * * *